(12) United States Patent
Ramaraju et al.

(10) Patent No.: US 9,418,741 B1
(45) Date of Patent: Aug. 16, 2016

(54) CONTENT ADDRESSABLE MEMORY WITH SEARCH LINE TEST CIRCUITRY

(71) Applicant: FREESCALE SEMICONDUCTOR, INC., Austin, TX (US)

(72) Inventors: Ravindraraj Ramaraju, Round Rock, TX (US); Qadeer A. Qureshi, Dripping Springs, TX (US); Henning F. Spruth, Austin, TX (US); Reinaldo Silveira, Sao Paulo (BR)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/835,322

(22) Filed: Aug. 25, 2015

(51) Int. Cl.
*G11C 29/08* (2006.01)
*G11C 15/00* (2006.01)
*G11C 29/12* (2006.01)

(52) U.S. Cl.
CPC ............... *G11C 15/00* (2013.01); *G11C 29/08* (2013.01); *G11C 29/12* (2013.01)

(58) Field of Classification Search
CPC .............................. G11C 29/08; G11C 15/04
USPC ............................................. 365/49.17, 201
See application file for complete search history.

(56) References Cited

U.S. PATENT DOCUMENTS

| | | | | |
|---|---|---|---|---|
| 6,362,990 B1 * | 3/2002 | Gibson | ........... | G11C 15/00 365/230.03 |
| 7,228,378 B1 * | 6/2007 | Pereira | ........... | G11C 15/00 365/49.15 |
| 7,274,581 B1 | 9/2007 | Powell et al. | | |
| 7,624,313 B2 | 11/2009 | Wickeraad et al. | | |
| 7,940,541 B2 | 5/2011 | Ali et al. | | |
| 8,023,299 B1 * | 9/2011 | Gharia | ........... | G11C 11/16 365/49.1 |
| 8,046,642 B2 | 10/2011 | Wickeraad et al. | | |
| 2007/0058407 A1 * | 3/2007 | Dosaka | ........... | G11C 15/04 365/189.15 |
| 2008/0192754 A1 * | 8/2008 | Ku | ........... | H04L 45/00 370/395.32 |
| 2009/0070525 A1 * | 3/2009 | Dosaka | ........... | G11C 15/04 711/108 |
| 2009/0250820 A1 * | 10/2009 | Argyres | ........... | H01L 23/585 257/758 |
| 2011/0197021 A1 * | 8/2011 | Burda | ........... | G06F 9/3857 711/108 |
| 2013/0182482 A1 * | 7/2013 | Akiyama | ........... | G11C 15/00 365/49.17 |

OTHER PUBLICATIONS

Wright, "A Comprehensive Test and Diagnostic Strategy for TCAMs", A thesis presented to the University of Waterloo in fulfillment of the thesis requirement for the degree of Master of Applied Science in Electrical and Computer Engineering, 2004, pp. 1-70.
Wu et al, "A comprehensive TCAM test scheme: An optimized test algorithm considering physical layout and combining scan test with at-speed BIST design", International Test Conference, Nov. 1-6, 2009, pp. 1-10, Austin, TX.
Grigoryan et al, "Generic BIST architecture for testing of content addressable memories", 17th International On-Line Testing Symposium, Jul. 13-15, 2011, pp. 86-91, Athens.
Du et al, "Testing delay faults in embedded CAMs", 12th Asian Test Symposium, Nov. 16-19, 2003, pp. 378-383.

* cited by examiner

Primary Examiner — Michael Tran

(57) ABSTRACT

A content addressable memory (CAM) and methods of operating a CAM are provided. The method for operating a CAM includes: during a first mode, performing a search function in a CAM bit array, the search result output at a match port of the CAM bit array; and during a second mode, columnwise reading data in the CAM bit array, the read column data output at the match data port of the CAM bit array. The method may include writing the CAM bit array with a predetermined data pattern. The method may further include providing an indication of pass/fail based upon comparing the read column data with expected data.

18 Claims, 8 Drawing Sheets

COLUMN READ BIST

SIGNATURE BIST

CONTENT ADDRESSABLE MEMORY WITH SEARCH LINE TEST CIRCUITRY

BACKGROUND

1. Field of the Disclosure

The present disclosure relates in general to content addressable memory, and more specifically to built-in self-test for content addressable memory.

2. Description of the Related Art

Testing content addressable memory (CAM) is time consuming and requires specialized logic thus increasing CAM test cost. For cost effective production of devices that include CAM and for standalone CAM devices, it is desirable to develop techniques that reduce the size of built-in self test (BIST) logic as well as reduce test time.

BRIEF DESCRIPTION OF THE DRAWINGS

The benefits, features, and advantages of the present disclosure will become better understood with regard to the following description, and accompanying drawings where.

DETAILED DESCRIPTION

Embodiments of devices and methods disclosed herein provide built-n self-test for content addressable memory (CAM) devices capable of using structures typically used to test static random access memory (SRAM) and read only memory (ROM) to test content addressable memory (CAM). A CAM array is configured to operate in a column read mode through a match port to exercise all transistors in the CAM. In the column read mode, the search lines (including true and complementary search lines) are used independently to read columns of data in the array. During BIST of a CAM, the contents of the CAM are read to check whether the memory is operating properly. Read operations require two clock cycles to read out the contents of key and mask bit of an entry. The number of entries is usually greater than the width (number of bit cells in a row) of the CAM. By reading out the content of the memory array through a modified match line port, the data of the CAM can be read by columns, and since there are generally fewer columns than rows in the memory array, a faster read of the entire contents of the CAM is achieved. In a signature mode, the true and complementary search lines are used as complements of one another to determine whether a comparand matches data in any of the memory cells. Both signature and column read BIST modes can be used to thoroughly test the CAM including the memory cell circuitry as well as the match circuitry.

Figure 1:
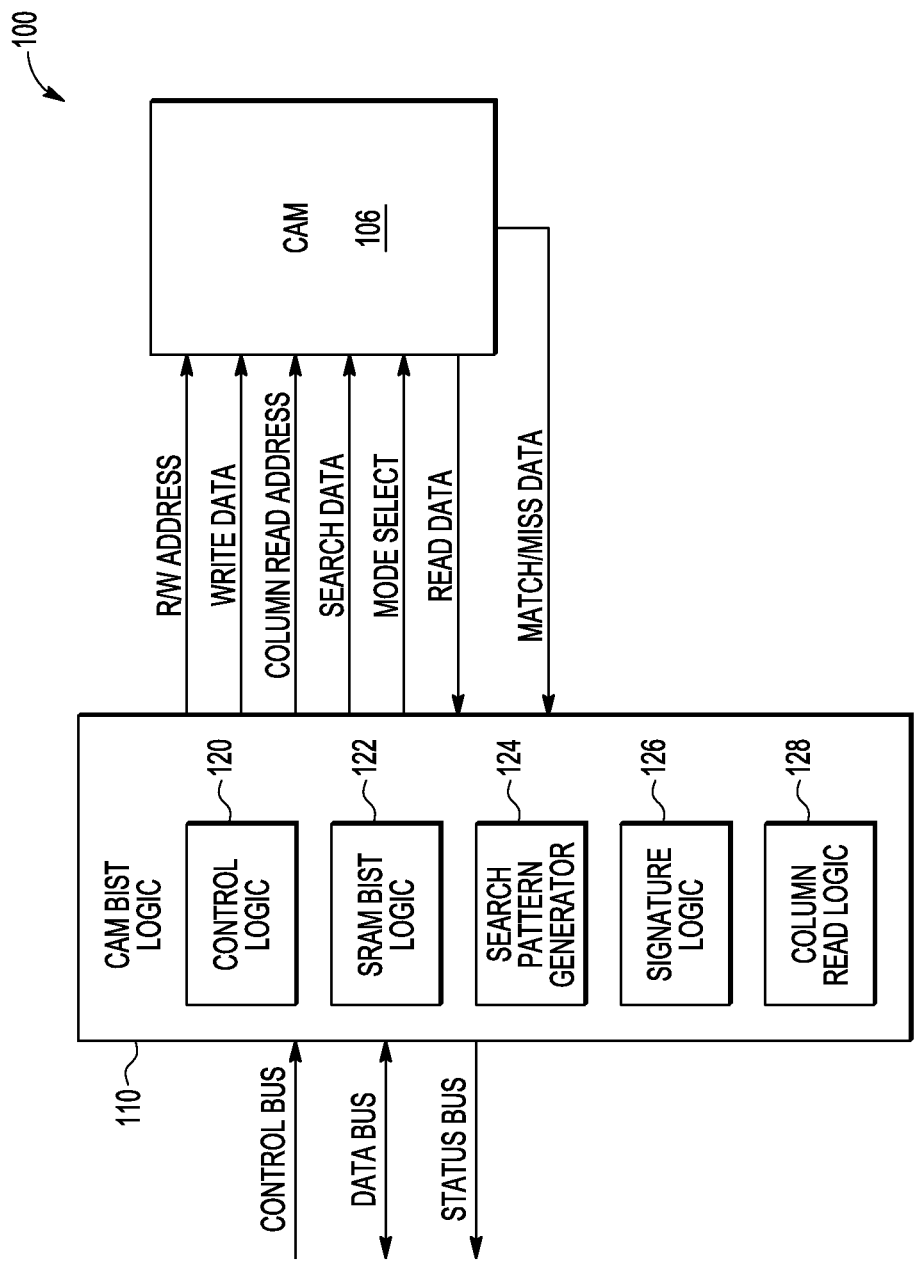
FIG. 1 is a block diagram of a content addressable memory (CAM) device with built-in self-test (BIST) logic according to one embodiment.

FIG. 1 is a block diagram of a content addressable memory (CAM) system 100 with CAM device 106 and CAM built-in self-test (BIST) logic 110 according to one embodiment. CAM BIST logic 110 includes control logic 120, SRAM BIST logic 122, search pattern generator 124, signature logic, 126 and column mode read logic 128. CAM BIST logic 110 can be coupled to a control bus, data bus, and status bus that allows CAM system 100 to communicate with another device such as a microprocessor (not shown) or other suitable device. The control bus can provide an indication of a type of operation that is to be performed while bidirectional data bus can provide address information and data to be written to the specified address in CAM device 106 to BIST logic 110 and receive data from BIST logic 110 that is read from CAM device 106.

BIST logic 110 is coupled to CAM device 106 to provide read/write (R/W) addresses, data to be written in CAM device 106, data or comparand that is to be searched for or matched in CAM device 106, and a mode select parameter. CAM device 106 can provide data read from the memory array and match/miss data indicating whether the search data or comparand were found in the memory array to BIST logic 110. The mode select parameter can specify whether CAM device 106 is to operate in RAM, search, or column read mode.

CAM system 100 may be implemented as part of a System on Chip (SOC) or the like which includes at least one processor (not shown) coupled to the CAM system 100 via an appropriate interface (not shown), such as a bus or the like with multiple signals or bits. The integrated circuit device may include other circuits, modules or devices, such as other memory devices (not shown), other functional modules (not shown), and external interfaces, such as input, output or input/output (I/O) ports or pins or the like (not shown). In one alternative embodiment, the CAM system 100 is implemented alone in an integrated circuit without any other devices. In another alternative embodiment, CAM system 100 can be part of a larger system on the integrated circuit.

Control logic 120 is configured to determine whether column read BIST or signature BIST is to be used to test CAM device 106 and to set a mode select parameter that is used by SRAM BIST logic, search pattern generator 124, signature logic 126, and column read logic 128. SRAM BIST logic 122 is configured to write a known pattern of data in CAM device 106 during either column read or signature mode BIST. During BIST, the pattern of data written to and then read from CAM device 106 is compared to the data generated by search pattern generator 124 to determine whether CAM device 106 is operating properly. Search pattern generator 124 is configured to generate a search or test pattern for the data to be written to CAM device 106 during BIST. Signature logic 126 is configured to generate addresses to be used to read the data in CAM device 106 by row during BIST in the search or signature mode. Column read logic 128 is configured to generate addresses to be used to read the data in CAM device 106 by column during BIST in the column read mode. In signature or search BIST mode, past and current match indicators from CAM device 106 are compressed into a signature that indicates whether any of the data in the comparand did not match the data written to the memory cells in CAM device 106. In column read BIST mode, match/miss data can be provided for each memory cell to indicate not only that a failure occurred, but also with memory cell(s) experienced a failure.

Figure 2:
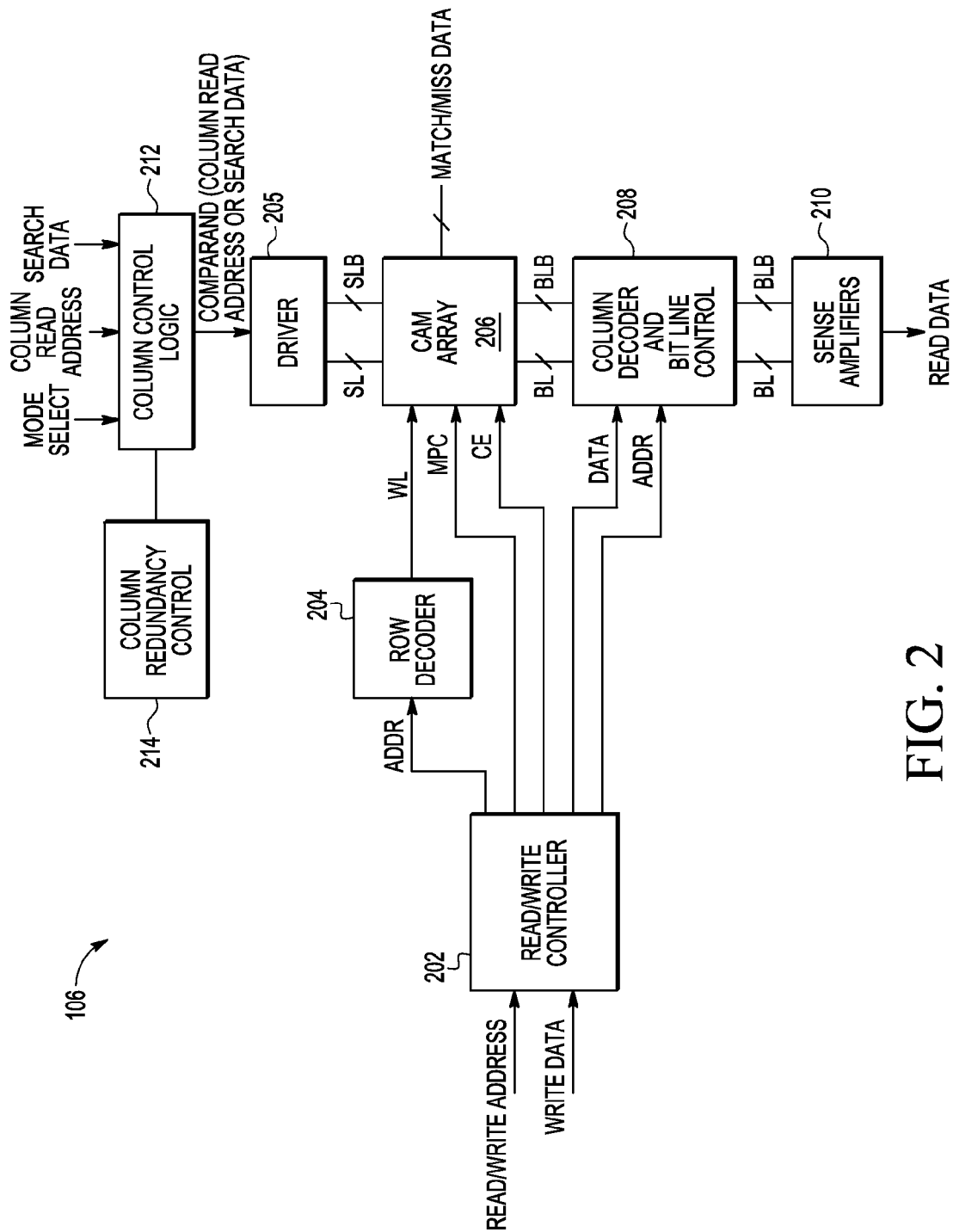
FIG. 2 is a schematic diagram of an embodiment of a CAM device that may be used in the CAM device with BIST of FIG. 1.

FIG. 2 is a block diagram of an embodiment of content addressable memory (CAM) device 106 that includes CAM array 206 coupled to controller 202, row decoder 204, comparand driver 205, and column decoder and bit line control 208. Controller 202 receives address and data requests/signals from a processor (not shown) and is coupled to provide address information to row decoder 204, data and address information to column decoder and bit line control 208, and match pre-charge (MPC) and compare enable (CE) indicators to CAM array 206. The MPC indicator is set to enable or disable a pre-charge switch (not shown) that is connected to a match comparator (not shown) for each bit cell in a row. The match comparators indicate whether the comparand matches data stored in corresponding bit cells. The CE indicator is used to control operation of the match comparators.

Column decoder and bit line control 208 is coupled to CAM array 206 by true and complementary bit lines (BL and BLB). Word line (WL) is coupled between row decoder 202 and CAM array 206. Comparand driver 205 is coupled to CAM array 206 by true and complementary search lines (SL and SLB). CAM array 206 provides match or miss indicators that are set to indicate whether there is a difference between a comparand and a corresponding data word in the primary area of CAM array 206. Column control logic 212 is coupled to receive mode select, column read address, and search or comparand data and to provide a comparand to driver 205. The comparand will be either a column read address or search data, depending on whether mode select indicates CAM system 100 is operating in RAM, CAM search, or column read mode.

Column redundancy bus 214 is coupled to column control logic 212 to repair a bad bit cell in CAM array 206. In process of fabricating the CAM device 100, a certain number of bit cells are expected to fail as part of the normal yield and if the bit cell cannot be repaired or changed then the entire CAM device 100 has to be discarded. So to improve the yield, additional (redundant) column(s) of bits can be added and used to replace columns with one or more bad bit cells. During BIST, when column with a bad bit cell is identified, the column with the bad bit cell(s) can be replaced by one of the redundant columns and the replacement information is provided by column redundancy bus 214. This information is used by column control logic 212 to replace the bad bit cell column.

Controller 202 controls read and write operations of the CAM array 206 through row decoder 204 and column decoder and bit line control 208, such as in response to requests from one or more processors. CAM controller 202 accesses memory cells within CAM array 206 by providing a row address to the row decoder 204 and a column address to column decoder and bit line control 208. Data is written into or read from the CAM array 206 via column decoder and bit line control 208.

Multiple bit lines BL and complementary bit lines BLB are coupled between CAM array 206 and column decoder and bit line control 208, and between sense amplifiers 210 and column decoder and bit line control 208. Sense amplifiers 210 provide data from CAM array 206 to one or more processors.

CAM device 106 can be used in many different applications such as data routing systems (e.g., switches and routers) to look up addresses of the packets that flow through the switches and to correlate incoming data addresses to communication channel outputs so that data is quickly routed through telecom systems. This includes MAC address lookup for Ethernet switching, ATM VPI/VCI lookup for ATM switches and IP address lookup in routers. CAM device 106 can also be used for classification of packets and other diverse applications such as pattern matching, voice recognition, data compression, branch target address cache or MMUs inside a microprocessor, etc.

One type of CAM architecture is referred to as the binary CAM. The binary CAM stores different N bit tags in many different rows of memory in the CAM. During operation, the CAM is provided with N bit compare values and compares these N bit compare values with the N bit tags in order to determine if there is a match in the CAM. In order for a hit or match to occur in the CAM, every bit in the N bit tag must match an associated bit within the same bit position of the N bit data value.

Another CAM architecture is referred to as ternary CAM and is used when certain fields of the addresses are masked. In a ternary CAM, N bit tags that are stored within the CAM may be compared against input values that have been masked by a mask value. The mask value creates "don't care" bits within the compare value so that a hit can occur in the ternary CAM even when only some of the tag bits stored with the ternary CAM match the input compare value. Ternary CAM devices require 2 bits per memory cell so the mask can be implemented when both bits store a "0". Binary CAM requires just one bit per memory cell. CAM device 106 can have either a ternary CAM or binary CAM architecture.

Figure 3:
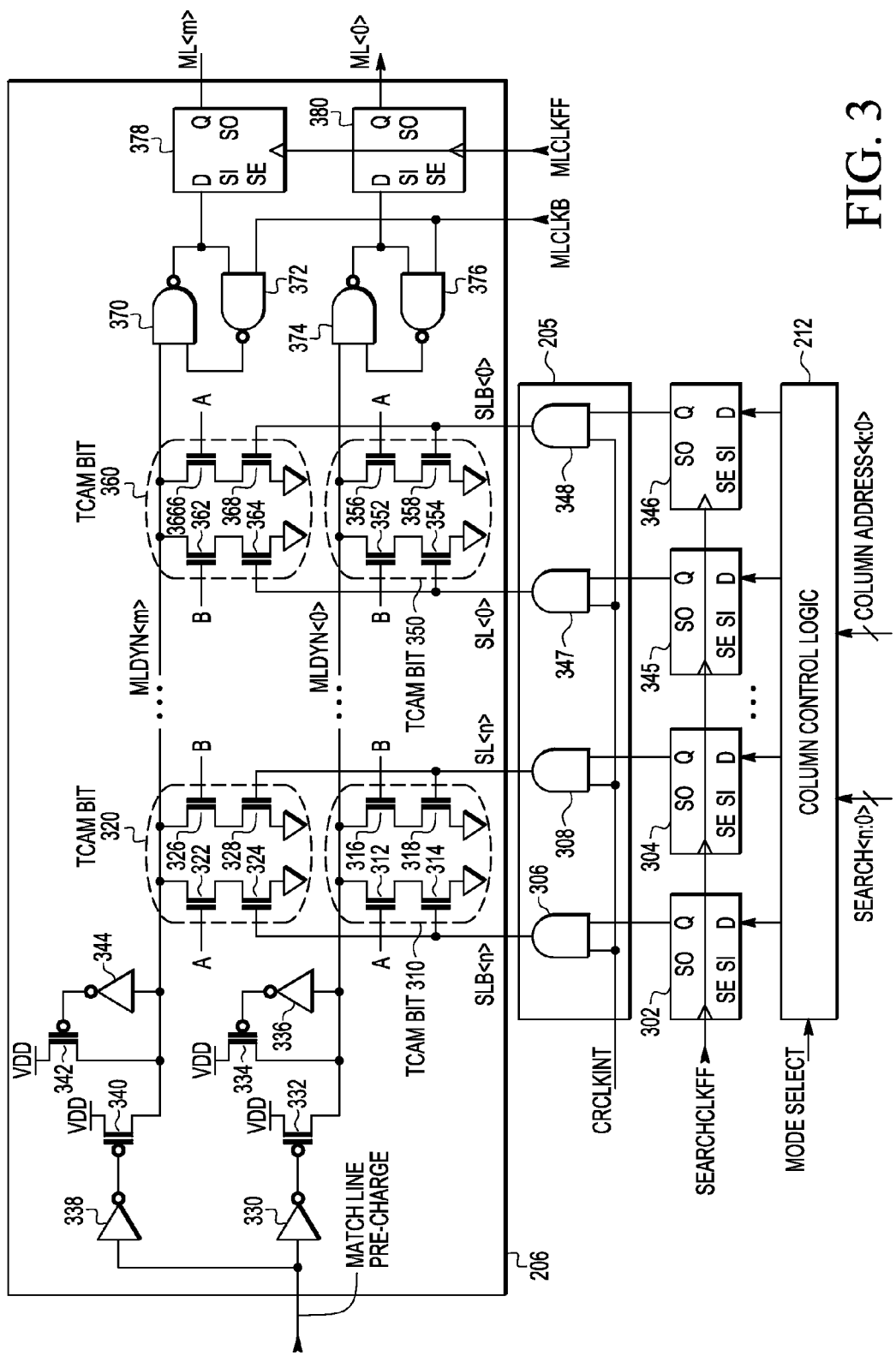
FIG. 3 is a schematic diagram showing further detail of portions of an embodiment of the CAM device that may be used in the CAM device of FIG. 2.

FIG. 3 is a schematic diagram showing further detail of portions of an embodiment of the CAM device 106 that may be used in the CAM system 100 of FIG. 1. Note that for simplicity of description, CAM array 206 of FIG. 3 does not include bit cells, but does include four search clock flip-flop circuits 302, 304, 345, 346 coupled to receive respective true search line signals SEARCH<0:n> and complementary search line signals SEARCHB<0:n> from column control logic 212 and a search clock control signal SEARCHCLKFF from a system clock or other suitable clock. True and complementary search interval signals SEARCHINT<0:n> and SEARCHBINT<0:n> are coupled to a first input of respective AND gates 306, 308, 347 and 348. A second input of each of AND gates 306, 308, 347 and 348 is coupled to a search clock interval signal SEARCHCLKINT. The output of each of AND gates 306, 308, 347 and 348 provides a respective one of true search lines SL <0:n> or complementary search lines SLB <0:n>.

CAM device 106 also includes four match comparators 316, 326, 356, 360 that each have a respective set of four N-channel transistors 312-318, 322-328, 352-358, and 362-368. For match comparator 310, drain electrodes of transistors 312 and 316 are coupled to first dynamic match line MLDYN<0>. Source electrodes of transistors 314 and 318 are coupled to ground. Source electrodes of transistors 312, 316 are coupled to the drain electrodes of respective transistors 314, 318. A control electrode of transistor 312 is coupled to node A. A control electrode of transistor 316 is coupled to Node B. A control electrode of transistor 314 is coupled to complementary search line SLB<n>. A control electrode of transistor 318 is coupled to search line SL<n>.

For match comparator 320, drain electrodes of transistors 322 and 326 are coupled to first dynamic match line MLDYN<m>. Source electrodes of transistors 324 and 328 are coupled to ground. Source electrodes of transistors 322, 326 are coupled to the drain electrodes of respective transistors 324, 328. A control electrode of transistor 322 is coupled to node A. A control electrode of transistor 326 is coupled to node B. A control electrode of transistor 324 is coupled to complementary search line SLB<n>. A control electrode of transistor 328 is coupled to search line SL<n>.

With regard to match comparator 350, drain electrodes of transistors 352 and 356 are coupled to first dynamic match line MLDYN<0>. Source electrodes of transistors 354 and 358 are coupled to ground. Source electrodes of transistors 352, 356 are coupled to the drain electrodes of respective transistors 354, 358. A control electrode of transistor 352 is coupled to node A. A control electrode of transistor 356 is coupled to Node B. A control electrode of transistor 354 is coupled to complementary search line SLB<0>. A control electrode of transistor 358 is coupled to search line SL<0>.

Regarding match comparator 360, drain electrodes of transistors 362 and 366 are coupled to first dynamic match line MLDYN<m>. Source electrodes of transistors 364 and 368 are coupled to ground. Source electrodes of transistors 362, 366 are coupled to the drain electrodes of respective transistors 364, 368. A control electrode of transistor 362 is coupled to node A. A control electrode of transistor 366 is coupled to Node B. A control electrode of transistor 364 is coupled to complementary search line SLB<0>. A control electrode of transistor 368 is coupled to search line SL<0>.

Dynamic match line MLDYN<0> is precharged by a match line pre-charge signal that is provided as input to inverter 330. The output of inverter 330 is coupled to a control electrode of P-channel transistor 332. A source electrode of P-channel transistor 332 is coupled to supply voltage VDD and a drain electrode of P-channel transistor 332 is coupled to dynamic match line MLDYN<0>. Additionally, dynamic match line MLDYN<0> is coupled as an input to inverter 336. The output of inverter 336 is coupled to a control electrode of P-channel transistor 334. A source electrode of P-channel transistor 334 is coupled to supply voltage VDD and a drain electrode of P-channel transistor 334 is coupled to dynamic match line MLDYN<0>. Inverters 330/336 and transistors 334, 332 form keeper circuitry to provide leakage current to the dynamic match line when it is not evaluated to "0".

The end of dynamic match line MLDYN<0> is coupled as an input to a set/reset NAND latch that includes NAND gate 374 having a first input coupled to the dynamic match line MLDYN<0>, a second input coupled to an output of NAND gate 376 and an output coupled to an input of NAND gate 376 and to a data port of flip-flop circuit 380. Another input of NAND gate 376 is coupled to a complementary match line clock signal (MLCLKB) that is provided by a system clock or other suitable clock. In addition to a data input coupled to the output of NAND gate 374, flip-flop circuit 380 includes a control input coupled to a match line clock flip-flop signal (MLCLKFF) that is provided by a suitable clock. An output of flip-flop circuit 380 is a match line signal (ML<0>) that indicates whether the comparand was a match with data in memory cells coupled to dynamic match line MLDYN<0>. NAND gates 374 and 376 are sensitive to the voltage level of dynamic match line MLDYN<0> whereas flip-flop circuit 380 will store the value of the output of NAND gate 370, which is the complement of dynamic match line MLDYN<0>, when the match line clock flip flop signal (MLCLKFF) is triggered.

Dynamic match line MLDYN<m> is precharged by a match line pre-charge signal that is provided as input to inverter 338. The output of inverter 338 is coupled to a control electrode of P-channel transistor 340. A source electrode of P-channel transistor 340 is coupled to supply voltage VDD and a drain electrode of P-channel transistor 340 is coupled to dynamic match line MLDYN<m>. Additionally, dynamic match line MLDYN<m> is coupled as an input to inverter 344. The output of inverter 344 is coupled to a control electrode of P-channel transistor 342. A source electrode of P-channel transistor 342 is coupled to supply voltage VDD and a drain electrode of P-channel transistor 342 is coupled to dynamic match line MLDYN<m>. Inverters 338/344 and transistors 342, 340 are precharge circuitry for the dynamic match line.

The end of dynamic match line MLDYN<m> is coupled as an input to a set/reset NAND latch that includes NAND gate 370 having a first input coupled to the dynamic match line MLDYN<m>, a second input coupled to an output of NAND gate 372 and an output coupled to an input of NAND gate 372 and to a data port of flip-flop circuit 378. Another input of NAND gate 372 is coupled to a complementary match line clock signal (MLCLKB) that is provided by a system clock or other suitable clock. In addition to a data input coupled to the output of NAND gate 370, flip-flop circuit 378 includes a control input coupled to a match line clock flip-flop signal (MLCLKFF) that is provided by a suitable clock. An output of flip-flop circuit 378 is a match line signal (ML<m>) that indicates whether the comparand was a match with data in memory cells coupled to dynamic match line MLDYN<m>. NAND gates 370 and 372 are sensitive to the voltage level of dynamic match line MLDYN<m> whereas flip-flop circuit 378 will store the output of NAND gate 370, which is the complementary value of dynamic match line MLDYN<m>, when the match line clock flip flop signal (MLCLKFF) is triggered.

Figure 4:
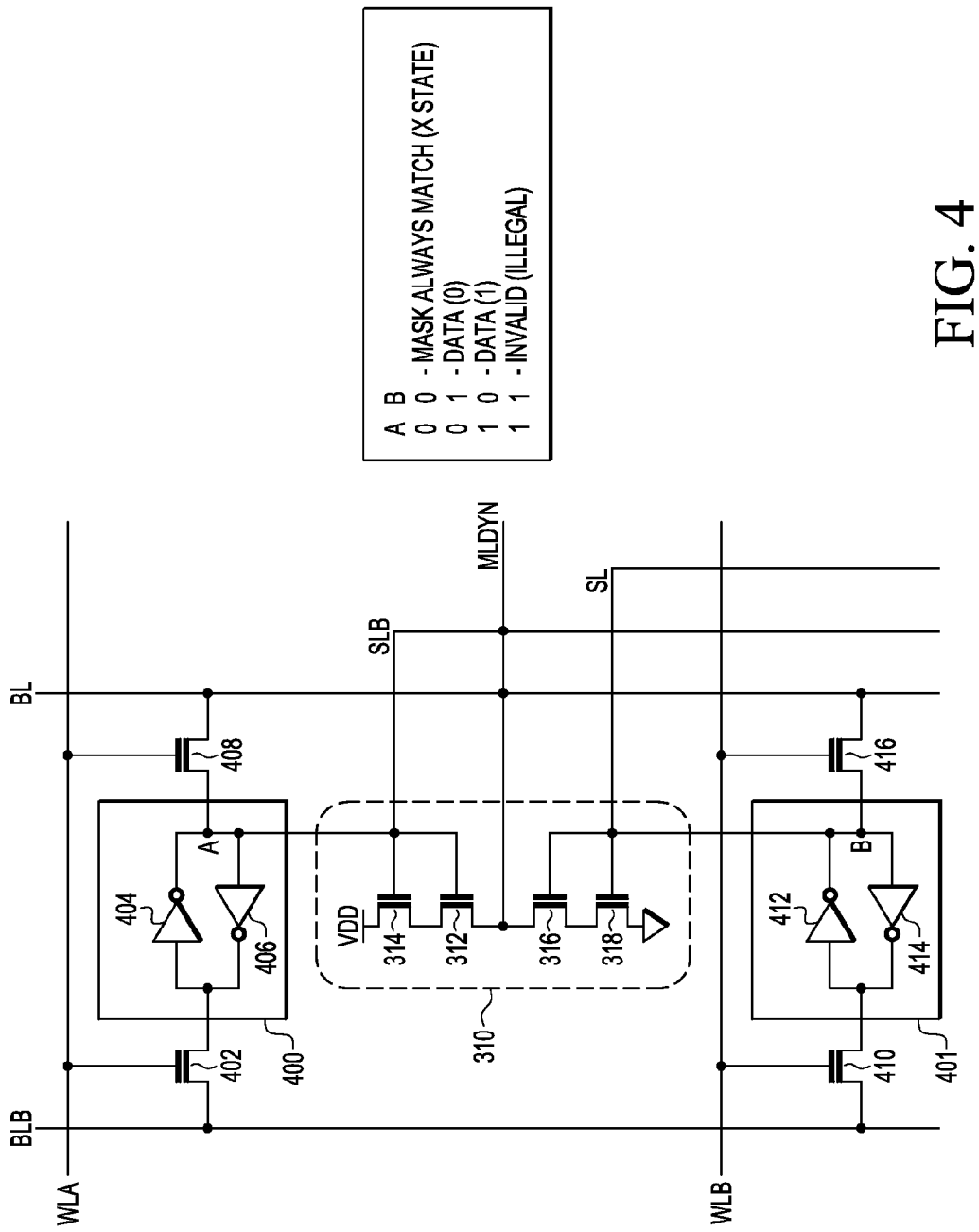
FIG. 4 is a schematic diagram of an embodiment of a portion of a ternary CAM that may be used in a CAM bit array of the CAM device of FIG. 2.

Referring to FIGS. 3 and 4, FIG. 4 is a schematic diagram of an embodiment of a ternary CAM (TCAM) cell with bit cells 400, 401 coupled to match comparator 310 that may be used in CAM array 206 of CAM device 100 of FIG. 2. A binary CAM array 206 would include just one memory cell coupled to comparator 310. Bit cell 400 includes a pair of cross-coupled inverters 404, 406, with the output of inverter 406 coupled to the input of inverter 404, and the output of inverter 404 coupled to the input of inverter 406. Access transistor 402 has a drain electrode coupled to a first complementary bit line BLB0, a gate electrode coupled to first word line WLA, and a source electrode coupled between the output of inverter 406 and the input of inverter 404. Access transistor 408 has a drain electrode coupled to first true bit line BL0, a gate electrode coupled to a first word line WLA, and a source electrode coupled at node A between the input of inverter 406 and the output of inverter 404.

Bit cell 401 includes a pair of cross-coupled inverters 412, 414, with the output of inverter 414 coupled to the input of inverter 412, and the output of inverter 412 coupled to the input of inverter 414. Access transistor 410 has a drain electrode coupled to a first complementary bit line BLB0, a gate electrode coupled to second word line WLB, and a source electrode coupled between the output of inverter 414 and the input of inverter 412. Access transistor 416 has a drain electrode coupled to first true bit line BL0, a gate electrode coupled to second word line WLB, and a source electrode coupled at node B between the input of inverter 414 and the output of inverter 412.

Match comparator 310 includes N-channel transistors 312, 314, 316, and 318. N-channel transistor 314 has a source electrode coupled to ground, a drain electrode coupled to a source electrode of N-channel transistor 312, and a control electrode coupled to complementary search line SLB. N-channel transistor 312 has a source electrode coupled to the drain electrode of transistor 314, a drain electrode coupled to match line ML, and a control electrode coupled to node A of bit cell 400. N-channel transistor 316 has a drain electrode coupled to match line ML, a source electrode coupled to the drain electrode of transistor 318, and a control electrode coupled to node B of memory cell 401. N-channel transistor 318 has a source electrode coupled to ground, a drain electrode coupled to a source electrode of N-channel transistor 316, and a control electrode coupled to true search line SL.

During signature mode, search line SL and complementary search line SLB are driven with complementary values stored in flip-flop circuit 302, 304. Values of "0" being stored at nodes A and B indicate a mask value, which results in dynamic match line MLDYN being low, or a "match" since MLDYN is the complement of the match line signal ML. If a data value of "0" is stored at node A and a data value of "1" is stored at node B, the TCAM cell is storing a data value of "0" and match line ML will be high to indicate a match if search line SL is low. If the search line SL is high and the cell is storing a data value of "0", match line ML will be low indicating a mismatch. If a data value of "1" is stored at node A and a data value of "0" is stored at node B, the TCAM cell is storing a data value of "1" and match line ML will be high to indicate a match if search line SL is high. If the search line SL is low and the cell is storing a data value of "1", match line ML will be low indicating a mismatch between data in the TCAM memory cell and data on the search line SL. Note that during the signature mode, complementary search line SLB will have a value that is the complement of the value on the true search line SL. Further note that a data value of "1" being stored on both nodes A and B is considered invalid and not allowed.

The number of columns in CAM array 206 is usually less than the number of rows. Data in CAM array 206 can be read by column more quickly than reading by row. The mode select parameter can be set to indicate column read mode to column control logic 212. The true and complementary search lines SL are then driven during the column read operation and data values are read using match lines. In contrast, during a row read operation, the word lines are driven by row decoder 204 to select a row of memory cells and data is read using the true and complementary bit lines. Additionally, column read BIST mode includes testing not only the functionality of circuitry in memory cells but also the match circuitry including NAND gates 370-376 and flip-flop circuits 378, 380.

During column read mode, true search line SL and complementary search line SLB are driven with complementary values stored in flip-flop circuit 302, 304 according to the column read address, which is stored in flip-flop circuit 302, 304. During signature mode, in comparison, the values of true search line SL and complementary search line SLB will vary.

As an example of operation during column read mode, assume search line SL is low and complementary search line SLB is high and dynamic match line signal MLDYN is inverted by the operation of respective NAND gates 370-376. If a data value of "0" is stored at nodes A and B, the TCAM cell is being used as a mask bit and match line ML will be high to always indicate a match. A data value of "0" stored at node A and a data value of "1" stored at node B indicates the TCAM cell is storing a data value of "0" and match line ML will be high. If a data value of "1" is stored at node A and a data value of "0" is stored at node B, the TCAM cell is storing a data value of "1" and match line ML will be high. Note that a data value of "1" being stored on both nodes A and B is considered invalid and not allowed.

For a binary CAM, mask bits are not used so only one bit cell (for example, either bit cell 400 or 401 (FIG. 4)) storing a value of "1" or "0" will be coupled to match comparator 310. The value of the bit cell will be read using match line ML when column read mode is enabled.

Although not shown in FIG. 3 for simplicity, additional memory cells will be included in CAM array 206 and coupled to respective match comparators 320, 350, 360, similar to bit cells 400, 401 coupled to match comparator 310. Further, CAM device 106 can include additional word lines, true and complementary bit lines, match comparators, memory cells, true and complementary search lines, search line flip-flops, match line latches, and match line flip-flops.

Figure 5:
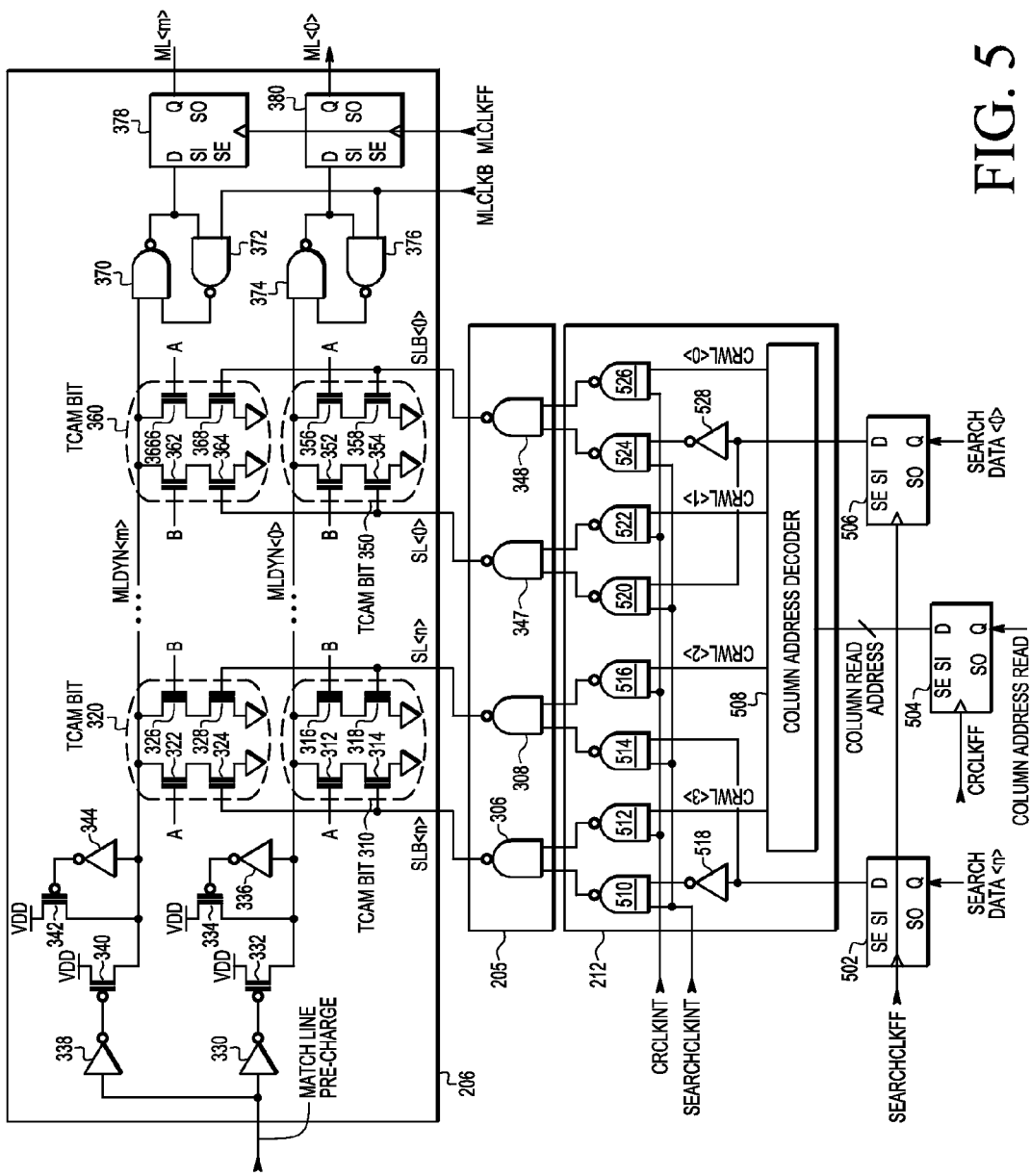
FIG. 5 is a schematic diagram showing further detail of portions of another embodiment of a CAM device that may be used in the CAM system of FIG. 1.

FIG. 5 is a schematic diagram showing further detail of portions of another embodiment of CAM device 106 that may be used in the CAM system 100 of FIG. 1. CAM array 206 and comparand driver 205 have the same architecture as CAM array 206 and comparand driver 205 shown in FIG. 3 are therefore not described in detail with reference to FIG. 5.

The embodiment of column control logic 212 shown in FIG. 5 includes column address decoder 508, inverters 518, 528, and NAND gates 510, 512, 514, 516, 520, 522, 524, 526. Flip-flops 502, 506 each include a control port coupled to a search clock flip-flop (SEARCHCLKFF) signal, a data input that receives a respective bit of search data<0:n>, and a data output that provides the a respective one of inverters 518, 528 and NAND gates 514, 520. Flip-flop 504 includes a control port coupled to a column read clock flip-flop (CRCLKFF) signal, a data input that receives a column read address and a data output that provides the column read address to column address decoder 508.

NAND gate 510 includes a first input coupled to search clock interval (SEARCHCLKINT) signal and a second input coupled to an output of inverter 518, which provides an inverted value for a bit search data <n>. An output of NAND gate 510 is coupled to an input of NAND gate 306.

NAND gate 512 includes a first input coupled to column read clock interval (CRCLKINT) signal and a second input coupled to an output of column address decoder 508, which provides a column read word line value (CRWL<2n–1>) for a column of data from which data is to be read using the true and complementary search lines. An output of NAND gate 512 is coupled to a second input of NAND gate 306.

NAND gate 514 includes a first input coupled to search clock interval (SEARCHCLKINT) signal and a second input coupled to the output of column address decoder 508, which provides a bit of search data <n>. An output of NAND gate 514 is coupled to an input of NAND gate 308.

NAND gate 516 includes a first input coupled to column read clock interval (CRCLKINT) signal and a second input coupled to an output of column address decoder 508, which provides a column read word line value (CRWL <2n–2>) for a column of data from which data is to be read using the true and complementary search lines. An output of NAND gate 516 is coupled to a second input of NAND gate 308.

NAND gate 520 includes a first input coupled to search clock interval (SEARCHCLKINT) signal and a second input coupled to the output of column address decoder 508, which provides a bit of search data <0>. An output of NAND gate 520 is coupled to an input of NAND gate 347.

NAND gate 522 includes a first input coupled to column read clock interval (CRCLKINT) signal and a second input coupled to an output of column address decoder 508, which provides a column read word line value (CRWL<1>) for a column of data from which data is to be read using the true and complementary search lines. An output of NAND gate 522 is coupled to a second input of NAND gate 347.

NAND gate 524 includes a first input coupled to search clock interval (SEARCHCLKINT) signal and a second input coupled to an output of inverter 528, which provides an inverted value for a bit search data <0>. An output of NAND gate 524 is coupled to an input of NAND gate 348.

NAND gate 526 includes a first input coupled to column read clock interval (CRCLKINT) signal and a second input coupled to an output of column address decoder 508, which provides a column read word line value (CRWL<0>) for a column of data from which data is to be read using the true and complementary search lines. An output of NAND gate 526 is coupled to a second input of NAND gate 348.

During column read mode, column address decoder provides the column address bits CRWL<0:2n−1> (for a total of 2n word lines) to respective NAND gates 512, 516, 522 and 526 and column read clock interval signal (CRCLKINT) is set so that the output of NAND gates 512, 516, 522 and 526 is low. The output of NAND gates 510 and 524 will be high due to inverters 518, 528 and the output of NAND gates 514 and 520 will be low. Since NAND gates 306, 348 have one input high and one input low, the output of NAND gates 306, 348 will be high and the output of NAND gates 308 and 347 will be low. Since search line SL is low and complementary search line SLB is high, if a data value of "0" is stored at nodes A and B, the TCAM cell is being used as a mask bit and match line ML will be high to always indicate a match. A data value of "0" stored at node A and a data value of "1" stored at node B indicates the TCAM cell is storing a data value of "0" and match line ML will be high. If a data value of "1" is stored at node A and a data value of "0" is stored at node B, the TCAM cell is storing a data value of "1" and match line ML will be high. Note that a data value of "1" being stored on both nodes A and B is considered invalid and not allowed.

During signature mode, search line SL and complementary search line SLB are driven with complementary values that are provided by NAND gates 306, 308, 347, 348. Regarding inputs to NAND gates 510-516 and 520-526, the column read word line (CRWL) address values will be "0" while the values for the search data<0:n> will depend on the value being searched. The search clock interval signal SEARCHCLKINT will be set high and the column read clock interval signal CRCLKINT will be set low. FOR TCAM cells, values of "0" being stored at nodes A and B indicate a mask value, which results in dynamic match line MLDYN being low, or a "match" since MLDYN is the complement of the match line signal ML. If a data value of "0" is stored at node A and a data value of "1" is stored at node B, the TCAM cell is storing a data value of "0" and match line ML will be high to indicate a match if search line SL is low. If the search line SL is high and the cell is storing a data value of "0", match line ML will be low indicating a mismatch. If a data value of "1" is stored at node A and a data value of "0" is stored at node B, the TCAM cell is storing a data value of "1" and match line ML will be high to indicate a match if search line SL is high. If the search line SL is low and the cell is storing a data value of "1", match line ML will be low indicating a mismatch between data in the TCAM memory cell and data on the search line SL. Note that during the signature mode, complementary search line SLB will have a value that is the complement of the value on the true search line SL. Further note that a data value of "1" being stored on both nodes A and B is considered invalid and not allowed.

For a binary CAM, mask bits are not used so only one bit cell (for example, either bit cell 400 or 401) storing a value of "1" or "0" will be coupled to match comparator 310. The value of the bit cell will be read using match line ML when column read mode is enabled.

Although not shown in FIG. 5 for simplicity, additional memory cells will be included in CAM array 206 and coupled to respective match comparators 320, 350, 360. Further, CAM device 106 can include additional word lines, true and complementary bit lines, match comparators, memory cells, true and complementary search lines, NAND gates coupled to column address decoder 508, match line latches, and match line flip-flops.

Figure 6:
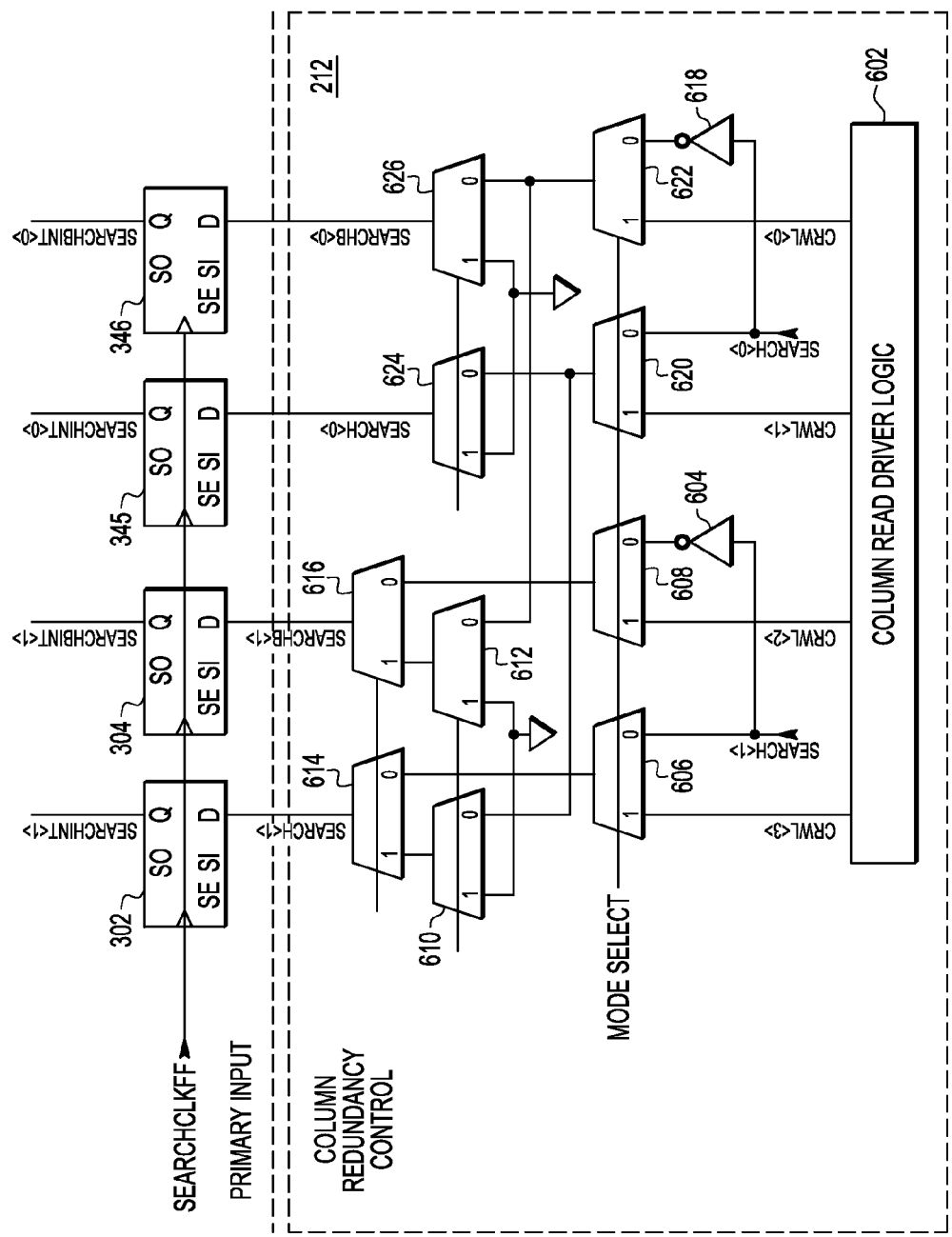
FIG. 6 is a schematic diagram showing further detail of portions of another embodiment of a CAM device that may be used in the CAM system of FIG. 1.

FIG. 6 is a schematic diagram showing further detail of portions of another embodiment of a CAM device 106 that may be used in the CAM system 100 of FIG. 1 to provide column redundancy control. Column control logic 212 includes column read logic 602, multiplexers 606, 608, 610, 612, 614, 616, 620, 622, 624, 626, and inverters 604, 618. Multiplexer 606 includes a first input couples to a column read word line signal CRWL<3>, a second input coupled to search data signal SEARCH <1>, a control input coupled to mode select signal used to select between column read and signature modes, and an output coupled to an input of multiplexer 614.

Multiplexer 608 includes a first input couples to a column read word line signal CRWL<2>, a second input coupled to an output of inverter 604, which is the complement of search data signal SEARCH <1>, a control input coupled to the mode select signal, and an output coupled to an input of multiplexer 616.

Multiplexer 620 includes a first input couples to a column read word line signal CRWL<1>, a second input coupled to search data signal SEARCH<0>, a control input coupled to mode select signal, and an output coupled to an input of multiplexer 624 and to an input of multiplexer 610.

Multiplexer 622 includes a first input couples to a column read word line signal CRWL<0>, a second input coupled to an output of inverter 618, which is the complement of search data signal SEARCH<0>, a control input coupled to the mode select signal, and an output coupled to an input of multiplexer 626 and to an input of multiplexer 612.

Multiplexer 610 further includes a second input coupled to a second input of multiplexer 612, an output coupled to a second input of multiplexer 614, and a control input coupled to a column redundancy control signal.

Multiplexer 612 further includes a second input coupled to an output of multiplexer 622, an output coupled to a second input of multiplexer 616, and a control input coupled to a column redundancy control signal.

Multiplexer 624 further includes a second input coupled to a second input of multiplexer 626, and a control input coupled to a column redundancy control signal.

Multiplexer 626 further includes an input coupled to the second input of multiplexer 624, and a control input coupled to a column redundancy control signal.

Multiplexers 614, 616, 624, 626 each include an output coupled to the data input of respective flip-flop circuits 302, 304, 345, 346.

During BIST, when a column with a bad bit cell is identified, the column with the bad bit cell(s) can be replaced by one of the redundant columns by setting the column redundancy control signals to switch to using the redundant column(s) instead of the column(s) with faulty bit cells. During normal operation when no faulty bits have been identified in the first or second column, the column redundancy control signals are set to zero and the outputs of corresponding multiplexers 606, 608, 620, 622 are output by multiplexers 614, 616, 624, 626 to respective flip-flop circuits 302, 304, 345, 346. If the first column contains a faulty bit and the second column is used to replace the first column, however, the column redundancy control signal is set to "1" for the first column in FIG. 6. The outputs of multiplexers 624, 626 will be zero since the selected inputs to multiplexers 624, 626 are shorted to ground. The column redundancy control signal coupled to multiplexers 610, 612 in the second column will be set to 0 (zero) to select the input to multiplexers 624 and 626. The outputs of multiplexers 610, 612 will then be the input to multiplexers 624 and 626. The column redundancy control signal coupled to multiplexers 614, 616 will be set to 1 to select the output of multiplexers 610, 612 instead of the output of multiplexers 606, 608. Column control logic 212 can include logic to keep track of which columns are equipped with redundancy circuitry, which columns have faulty bits, and whether or not the redundant column(s) are in use.

Figure 7:
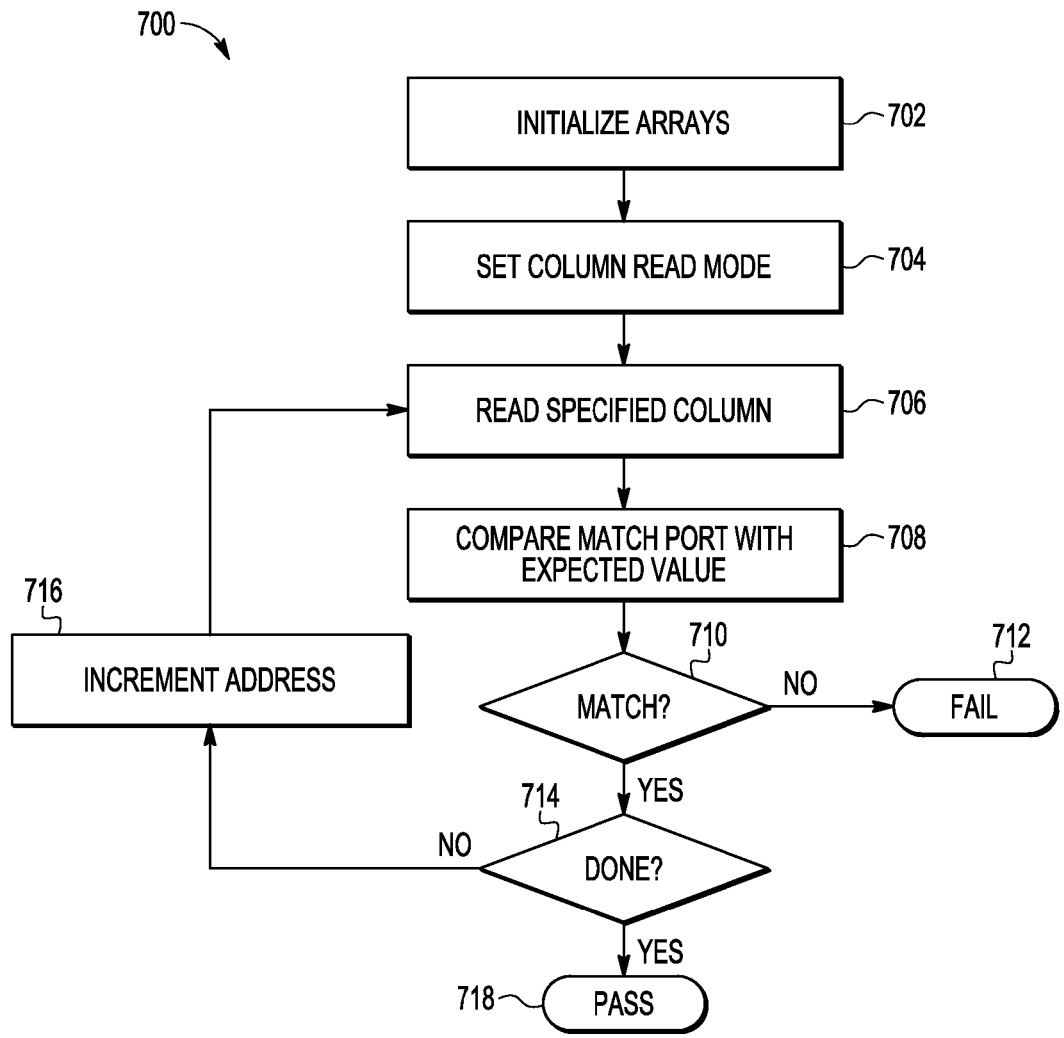
FIG. 7 is a flow diagram of an embodiment of a method for operating the CAM system of FIG. 1 during column read BIST.

Referring to FIGS. 2 and 7, FIG. 7 is a flow diagram of an embodiment of a method 700 for operating the CAM system 100 of FIG. 1 during column read BIST. Process 702 includes initializing CAM array 206 by writing a known pattern of data in the memory cells (e.g., 400 and 401 of FIG. 4). The write operation that is used to initialize the memory cells is the same as that used during regular operation to write data to the memory cells, such as static random access memory (SRAM) devices.

Process 704 includes setting the mode select parameter to column read BIST mode. Process 706 includes reading one or more columns in CAM device 106 using true and complementary search lines instead of word and bit lines to select and read the data from memory cells. Each memory cell has its own match line signal to indicate whether the data read from the memory cell matches the pattern written to the memory cell during the initialization stage in process 702. If a match line indicates a mismatch in process 710, information on which cell is provided by the index <0:m> of the match line for the column. If a failure is indicated in one or more of the memory cells, process 710 transitions to process 712 to provide a BIST failure indication to one or more processors and/or other suitable component in and/or coupled to CAM system 100. If the match lines in the column indicate no failure process 710 transitions to process 714 to determine whether all the columns have been tested. If not, process 714 transitions to process 716 to increment the column address and return to process 706 to read the next column. If all the columns have been tested, process 714 transitions to process 718 to indicate the column read BIST mode passed the test. Note that column read BIST mode thus allows all memory cells and match line circuitry including NAND latches (370/372, 374/376) and flip-flops 378, 380 shown in FIG. 3, to be tested during BIST.

Figure 8:
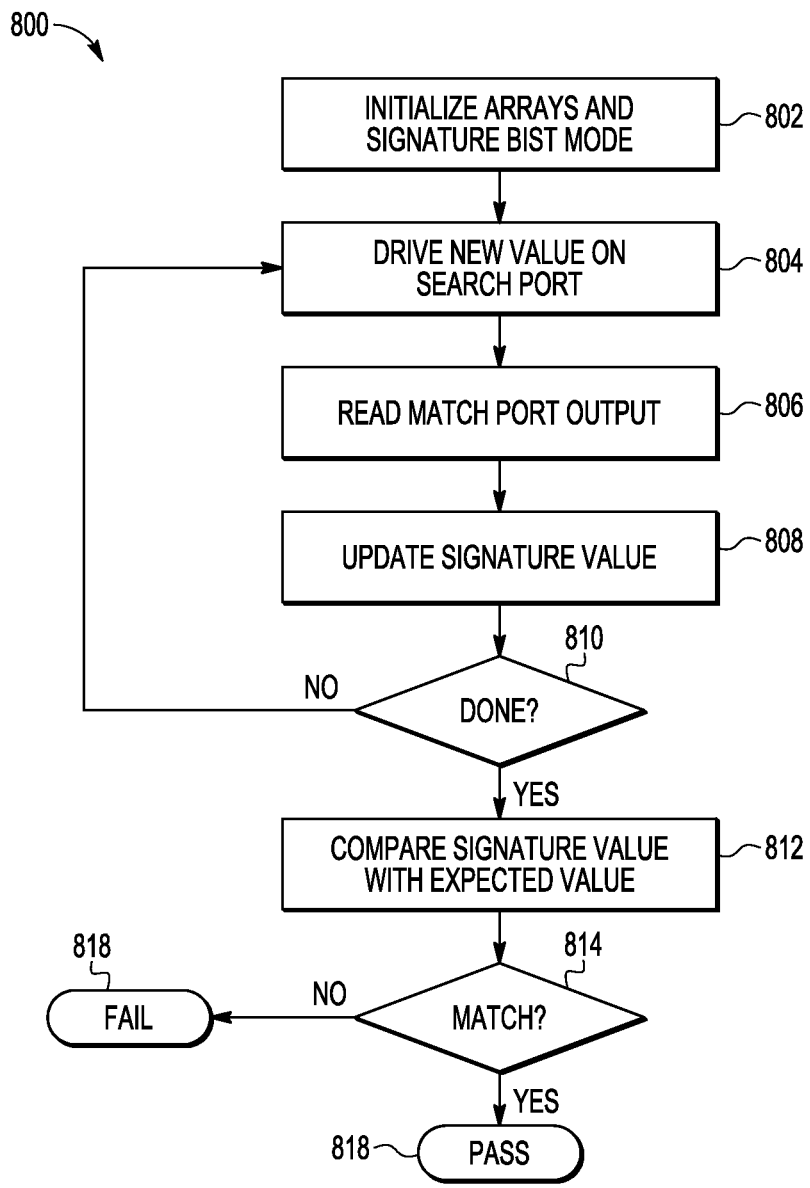
FIG. 8 is a flow diagram of an embodiment of another method for operating the CAM system of FIG. 1 during signature BIST.

Referring to FIGS. 2 and 8, FIG. 8 is a flow diagram of an embodiment of a method 800 for operating the CAM system 100 of FIG. 1 during signature BIST during which one or more rows of memory cells in CAM array 206 are tested. Process 802 includes initializing CAM array 206 by writing a known pattern of data in the memory cells (e.g., 400 and 401 of FIG. 4). The write operation that is used to initialize the memory cells is the same as that used during regular operation to write data to the memory cells, such as static random access memory (SRAM) devices. Process 802 also includes setting the mode select parameter to signature BIST mode, and initializing a signature value to zero.

Process 804 includes providing data values to CAM device 106 for a row of memory cells to be read. Process 806 includes reading a row of data in CAM device 106 using true and complementary bit lines and word lines to select and read the data from memory cells. Process 806 includes reading the match line for the row. Process 808 includes updating a BIST signature value, for example, a value in a multiple input shift register, based on the value of the match line. The signature for the initial data pattern in the array is calculated using a cyclic redundancy check or other suitable checksum operation. After each row of cells is read, the BIST signature value is updated. Once updated, the signature value represents past and current states of the output at the match line for the particular BIST.

Process 810 determines whether all of the rows in CAM array 206 have been tested. If not, process 810 transitions to process 804 to drive a new value on to the true and complementary search lines in the next row of memory cells. If all the rows in CAM array 206 have been tested, process 810 transitions to process 812 to compare the final signature value in the multi-input shift register or other component to a signature value determined by signature logic 126 (FIG. 1) based on the search pattern. In process 814, if the signature generated during the BIST is the same as a signature pre-determined by signature logic 126, process 814 transitions to process 816 to indicate that the signature BIST passed. Otherwise, process 814 transitions to process 818 to indicate that the signature BIST failed. The result of the BIST can be provided to one or more processors and/or other suitable component in and/or coupled to CAM system 100.

By now it should be appreciated that in some embodiments, a method for operating a content addressable memory (CAM) can comprise during a first mode (MODE SELECT), performing a search function in a CAM bit array (206), the search result output at a match port (MATCH/MISS DATA) of the CAM bit array. During a second mode, columnwise reading data (706) in the CAM bit array, the read column data output at the match data port of the CAM bit array.

In another aspect, the method can further comprise writing (WRITE DATA, WL) the CAM bit array with a predetermined data pattern (702) before columnwise reading data in the CAM bit array (706).

In another aspect, writing the CAM bit array with a predetermined data pattern includes decoding a row (204) and a column (208) corresponding to a read/write address (READ/WRITE ADDRESS).

In another aspect, the method can further comprise comparing the read column data with expected data (110, 708).

In another aspect, the second mode can be characterized as a test mode and comparing the read column data with expected data provides an indication of pass/fail (710).

In another aspect, the columnwise reading data in the CAM bit array uses search logic transistors in a CAM bit cell (FIG. 3).

In another aspect, the method can further comprise during the first mode, providing complementary search line data to CAM bit cells via a driver circuit (205) coupled to the CAM bit array, and during the second mode, providing a column address (716) to CAM bit cells via the driver circuit.

In another embodiment, a method for operating a content addressable memory (CAM) can comprise writing a CAM bit array (WRITE DATA, WL) with a predetermined data pattern (702). During a first mode, a search for a match in a CAM bit array is performed. The search result is output at a match port of the CAM bit array (MATCH/MISS DATA). During a second mode, a column of data (706) in the CAM bit array is read. The read column data is output at the match data port of the CAM bit array.

In another aspect, reading a column of data in the CAM bit array occurs within one read access cycle.

In another aspect, reading a column of data in the CAM bit array uses search logic transistors in a CAM bit cell (212, FIG. 3).

In another aspect, the method can further comprise using compare logic comparing the read column data with expected data (708), the compare logic included in a built-in self-test (BIST) unit coupled to the CAM (110).

In another aspect, the method can further comprise providing an indication of pass/fail (710) at the BIST unit upon comparing the read column data with expected data (110).

In another aspect, writing a CAM bit array with a predetermined data pattern can further comprise enabling a word line (204, WL) in the CAM bit array (206) corresponding to a read/write address (READ/WRITE ADDRESS); and selecting one or more bit lines (BL/BLB, 208) in the CAM bit array corresponding to the read/write address, wherein write data (WRITE DATA) is coupled to the one or more bit lines.

In still another embodiment, a content addressable memory (CAM), can comprise a CAM bit array (206) having rows and columns; and column control logic (212) coupled to the CAM bit array. The column control logic selects between a column read address and search data based on a mode select signal (MODE SELECT). A column in the CAM bit array is decoded based on the column read address, and a search function in the CAM bit array is based on the search data.

In another aspect, read/write control logic (202) is configured to write data in a row of the CAM bit array based on a read/write address (READ/WRITE ADDRESS).

In another aspect, the memory can further comprise a row decoder (204) coupled between the read/write control logic and the CAM bit array. The row decoder can activate a word line (WL) in the CAM bit array corresponding to the read/write address. A column decoder (208) is coupled between the read/write control logic and the CAM bit array. The column decoder selects one or more bit lines (BL/BLB) in the CAM bit array corresponding to the read/write address.

In another aspect, the memory can further comprise driver circuitry (205) coupled between the column control logic and the CAM bit array, the driver circuitry providing column addresses or complementary search line data (SL/SLB) based on the mode select signal.

In another aspect, the memory can further comprise built-in self-test (BIST) logic coupled to the CAM (110).

In another aspect, the BIST logic can include compare logic (110) wherein read data from a column is compared with expected data.

In another aspect, the memory can further comprise a column redundancy bus (214) can be coupled to the column control logic. The column redundancy bus can provide a replacement column for a defective column.

This disclosure is presented to enable one of ordinary skill in the art to make and use the present disclosure as provided within the context of a particular application and its requirements. Various modifications to the preferred embodiments will, however, be apparent to one skilled in the art, and the general principles defined herein may be applied to other embodiments. Therefore, the present disclosure is not intended to be limited to the particular embodiments shown and described herein, but is to be accorded the widest scope consistent with the principles and novel features herein disclosed.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of systems disclosed herein are circuitry located on a single integrated circuit or within a same device. Alternatively, the systems may include any number of separate integrated circuits or separate devices interconnected with each other. Also for example, a system or portions thereof may be soft or code representations of physical circuitry or of logical representations convertible into physical circuitry. As such, a system may be embodied in a hardware description language of any appropriate type.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the present disclosure has been described in considerable detail with reference to certain preferred versions thereof, other versions and variations are possible and contemplated. Those skilled in the art should appreciate that they can readily use the disclosed conception and specific embodiments as a basis for designing or modifying other structures for carrying out the same purposes of the present disclosure without departing from the scope of the disclosure as defined by the appended claims.

What is claimed is:

1. A method for operating a content addressable memory (CAM), the method comprising:
   during a first mode, performing a search function in a CAM bit array (206), the search result output at a match port of the CAM bit array; and
   during a second mode, columnwise reading data in the CAM bit array, the read column data output at the match data port of the CAM bit array, wherein the columnwise reading data in the CAM bit array uses search logic transistors in a CAM bit cell.

2. The method of claim 1, further comprising writing the CAM bit array with a predetermined data pattern before columnwise reading data in the CAM bit array.

3. The method of claim 2, wherein writing the CAM bit array with a predetermined data pattern includes decoding a row and a column corresponding to a read/write address.

4. The method of claim 1, further comprising comparing the read column data with expected data.

5. The method of claim 4, wherein the second mode is characterized as a test mode and comparing the read column data with expected data provides an indication of pass/fail.

6. The method of claim 1, further comprising:
   during the first mode, providing complementary search line data to CAM bit cells via a driver circuit (205) coupled to the CAM bit array; and
   during the second mode, providing a column address to CAM bit cells via the driver circuit.

7. A method for operating a content addressable memory (CAM), the method comprising:
   writing a CAM bit array with a predetermined data pattern;
   during a first mode, searching for a match in a CAM bit array, the search result output at a match port of the CAM bit array; and
   during a second mode, reading a column of data in the CAM bit array, the read column data output at the match data port of the CAM bit array;
   using compare logic comparing the read column data with expected data, the compare logic included in a built-in self-test (BIST) unit coupled to the CAM.

8. The method of claim 7, wherein reading a column of data in the CAM bit array occurs within one read access cycle.

9. The method of claim 7, wherein reading a column of data in the CAM bit array uses search logic transistors in a CAM bit cell.

10. The method of claim 7, further comprising providing an indication of pass/fail at the BIST unit upon comparing the read column data with expected data.

11. The method of claim 7, wherein writing a CAM bit array with a predetermined data pattern further comprises:
    enabling a word line in the CAM bit array corresponding to a read/write address; and
    selecting one or more bit lines in the CAM bit array corresponding to the read/write address, wherein write data is coupled to the one or more bit lines.

12. A content addressable memory (CAM), comprising:
    a CAM bit array having rows and columns; and
    column control logic coupled to the CAM bit array, the column control logic selecting based on a mode select signal, between a column read address and search data;
    wherein a column in the CAM bit array is decoded based on the column read address, and a search function in the CAM bit array is based on the search data.

13. The memory of claim 12, further comprising read/write control logic for writing data in a row of the CAM bit array based on a read/write address.

14. The memory of claim 13, further comprising:
    a row decoder coupled between the read/write control logic and the CAM bit array, the row decoder activating a word line in the CAM bit array corresponding to the read/write address; and
    a column decoder coupled between the read/write control logic and the CAM bit array, the column decoder selecting one or more bit lines in the CAM bit array corresponding to the read/write address.

15. The memory of claim 12, further comprising driver circuitry coupled between the column control logic and the CAM bit array, the driver circuitry providing column addresses or complementary search line data based on the mode select signal.

16. The memory of claim 12, further comprising built-in self-test (BIST) logic coupled to the CAM.

17. The memory of claim 16, wherein the BIST logic includes compare logic wherein read data from a column is compared with expected data.

18. The memory of claim 12, further comprising a column redundancy bus coupled to the column control logic, the column redundancy bus providing a replacement column for a defective column.

* * * * *